United States Patent
Furugori et al.

(10) Patent No.: US 6,836,068 B2
(45) Date of Patent: Dec. 28, 2004

(54) ORGANIC ELECTROLUMINESCENT DEVICE AND DISPLAY APPARATUS

(75) Inventors: Manabu Furugori, Kanagawa (JP); Shinjiro Okada, Kanagawa (JP); Akira Tsuboyama, Kanagawa (JP); Takao Takiguchi, Tokyo (JP); Seishi Miura, Kanagawa (JP); Takashi Moriyama, Kanagawa (JP); Jun Kamatani, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/122,199

(22) Filed: Apr. 16, 2002

(65) Prior Publication Data

US 2002/0180350 A1 Dec. 5, 2002

(30) Foreign Application Priority Data

Apr. 27, 2001 (JP) .................................... 2001-132494
Apr. 4, 2002 (JP) .................................... 2002-102025

(51) Int. Cl.[7] ............................................. H05B 33/22
(52) U.S. Cl. ..................... 313/506; 313/504; 313/112
(58) Field of Search ........................ 313/112, 504, 313/506, 509; 315/169.3; 428/917

(56) References Cited

U.S. PATENT DOCUMENTS

| | | | | |
|---|---|---|---|---|
| 4,143,297 A | * | 3/1979 | Fischer | 313/502 |
| 5,229,628 A | * | 7/1993 | Kobayashi et al. | 257/103 |
| 5,444,330 A | * | 8/1995 | Leventis et al. | 313/506 |
| 5,677,546 A | * | 10/1997 | Yu | 257/40 |
| 5,717,289 A | * | 2/1998 | Tanaka | 313/503 |
| 5,786,796 A | | 7/1998 | Takayama et al. | 345/76 |
| 5,834,894 A | * | 11/1998 | Shirasaki et al. | 313/509 |
| 5,986,401 A | | 11/1999 | Thompson et al. | 313/504 |
| 6,057,647 A | * | 5/2000 | Kurosawa et al. | 315/169.3 |
| 6,114,715 A | * | 9/2000 | Hamada | 257/72 |
| 6,137,459 A | * | 10/2000 | Eida et al. | 345/76 |
| 6,198,216 B1 | * | 3/2001 | Kosa et al. | 313/503 |
| 6,268,617 B1 | * | 7/2001 | Hirakata et al. | 257/72 |
| 6,369,507 B1 | * | 4/2002 | Arai | 313/506 |
| 6,459,199 B1 | * | 10/2002 | Kido et al. | 313/504 |
| 6,518,700 B1 | * | 2/2003 | Friend et al. | 313/504 |
| 6,525,466 B1 | * | 2/2003 | Jabbour et al. | 313/504 |
| 6,545,424 B2 | * | 4/2003 | Ozawa | 315/169.3 |
| 6,559,594 B2 | * | 5/2003 | Fukunaga et al. | 313/506 |

FOREIGN PATENT DOCUMENTS

| | | | |
|---|---|---|---|
| JP | 04225328 | * | 8/1992 |
| JP | 8-241057 | | 9/1996 |
| JP | 9-127885 | | 5/1997 |
| JP | 2000-315582 | | 11/2000 |

OTHER PUBLICATIONS

C.W. Tang et al., "Organic Electroluminescent Diodes", Appl. Phys. Lett., vol. 51, No. 12, pp. 913–915 (Sep. 21, 1987).

* cited by examiner

*Primary Examiner*—Ashok Patel
(74) *Attorney, Agent, or Firm*—Fitzpatrick, Cella, Harper & Scinto

(57) ABSTRACT

An organic electroluminescent device includes an organic compound layer containing luminescent sections placed between substantially transparent electrodes. An insulating light absorption layer is in contact with first electrodes, and the light absorption layer is placed between a substrate and the first electrodes.

13 Claims, 4 Drawing Sheets

ORGANIC ELECTROLUMINESCENT
DEVICE AND DISPLAY APPARATUS

BACKGROUND OF THE INVENTION

1. Field of the Invention

The present invention relates to display apparatuses, such as flat panel displays, and to organic electroluminescent devices used for the display apparatuses.

2. Description of the Related Art

Recently, emissive devices usable for flat panels have been receiving attention. Examples of emissive devices include plasma emission display devices, field emission devices, and electroluminescent devices (hereinafter referred to as "EL devices").

Among them, with respect to an organic EL device in particular, it has been demonstrated in 1987 by T. W. Tang et al. that light emission with high luminance can be achieved by low-voltage DC driving using a layered thin-film structure including a luminescent metal chelate complex and diamine molecules, and research and development thereof has been carried out extensively. In low molecular organic EL devices, displays which emit light of a single green (G) color or which emit blue (B) and red (R) light in addition to green (G) light as area colors have been commercially available, and full color displays have also been under development.

When the organic EL devices are used for display apparatuses, they must be driven at as low a current and voltage as possible in view of the lifetime restrictions on drivers, etc. In order to control the luminance, a driving method using switching elements, such as thin-film transistors (TFTs), is believed to be most suitable (refer to Japanese Patent Laid-Open No. 8-241057 and its corresponding U.S. Pat. No. 5,786,796).

The organic EL device is a carrier-injection type emissive device which uses light emission occurring when electrons and holes are recombined in a luminescent layer. FIG. 1 is a sectional view which schematically shows a conventional organic EL device. In FIG. 1, numeral 11 represents a metal electrode, numeral 12 represents a luminescent layer, numeral 13 represents a transparent electrode, and numeral 14 represents a transparent substrate. In general, preferably, a metal having a small work function, such as aluminum, is used as the cathode, and a transparent conductor having a large work function, such as indium tin oxide (ITO), is used as the anode. The reason for using such a material for the anode is that light from the luminescent layer is passed through the anode toward the outside. A luminescent layer containing an organic compound is sandwiched between the two electrodes. The thickness of the organic compound layer is usually approximately several tens of nanometers.

In the conventional organic EL device, the transparent electrode 13 composed of ITO or the like is formed on the transparent substrate 14 composed of glass or the like, and the luminescent layer 12 containing an organic compound and the metal electrode 11 serving as the cathode are deposited thereon in that order. Light from the luminescent layer 12 goes out from the transparent substrate 14 side.

When a display apparatus is fabricated using the organic EL device having such a structure and using switching elements, such as TFTs, for driving, the pixel aperture ratio is decreased because the switching elements are formed on the transparent substrate 14. Therefore, an organic EL device has been disclosed in which a substrate for forming switching elements is also placed on the side of the metal electrode 11. In such a structure, because the switching elements and circuits are provided on the side of the metal electrode 11, it is possible to design the device without aperture ratio restrictions, and thus, a high-efficiency, high-definition display can be fabricated.

However, in the organic EL device described above, ambient light entering from the transparent substrate side is totally reflected by the metal electrode, resulting in a decrease in contrast due to reflected glare, etc.

On the other hand, Japanese Patent Laid-Open No. 9-127885 discloses a display device in which, by providing a quarter-wave plate and a linearly polarizing plate (circularly polarizing filter) on the outer surface of the transparent substrate 14, reflection of ambient light can be reduced, thus preventing the reflected glare. However, when such a circularly polarizing filter is used, it is not possible for almost half of the light emitted from the luminescent layer to pass through the filter, resulting in a decrease in luminance.

Additionally, a method is also disclosed in which an antireflection layer is provided on the cathode (Japanese Patent Laid-Open No. 2000-315582). FIG. 2 is a sectional view which schematically shows a conventional organic EL device having such a structure. In FIG. 2, the same elements are shown by the same numerals as those of FIG. 1. Numeral 15 represents an antireflection layer.

Since a transparent conductor is preferably used for the anode and a metal is preferably used as the cathode in view of the work functions, as described above, the antireflection layer is inevitably provided on the luminescent layer side of the cathode. In such a structure, the luminance is not decreased by the polarizing filter as in the case described above. However, since the antireflection layer 15 is provided between the metal electrode 11 and the luminescent layer 12, the work function must be taken into consideration so as not to hinder the electron injection from the metal electrode 11 to the luminescent layer 12, and also the antireflection layer 15 must be composed of a material which does not inhibit conductivity of the device. Therefore, strict restrictions are imposed on the material.

A device is also disclosed in U.S. Pat. No. 5,986,401 in which an antireflection layer is provided below an organic EL layer. In this structure, a transparent organic EL layer is formed and then an antireflection layer is placed therebelow. In one embodiment, the organic EL layer is deposited on a substrate with a planarizing layer therebetween, and in the other embodiment the antireflection layer is formed under a transparent substrate provided with the organic EL device.

As a result of investigation by the present inventors, it is assumed that in the structure according to U.S. Pat. No. 5,986,401, since the planarizing layer or the glass substrate is placed between the organic EL layer and the antireflection layer, interference of light occurs, and thereby the antireflection effect is effectively decreased. As an electrode for the transparent organic EL device, a transparent electrode composed of ITO is usually used. When an ITO film is placed on the transparent substrate composed of glass or the like, or on the planarizing layer, which is generally colorless, it is known that a peculiar light reflection effect is produced therebetween and the presence of the ITO film becomes noticeable. Therefore, further enhancement of the antireflection effect has been demanded.

SUMMARY OF THE INVENTION

The present inventors have discovered a structure in which a superior antireflection effect is exhibited based on the structure described above. It is an object of the present invention to provide an electroluminescent device in which glare due to reflection of ambient light is suppressed without decreasing the luminance.

In one aspect of the present invention, an electroluminescent device includes: a plurality of first electrodes formed on a substrate by patterning; an organic compound layer containing a plurality of luminescent sections: a second electrode, the first electrodes and the second electrode being substantially light transmissive; and a light absorption layer composed of an electrical insulator, the light absorption layer being placed in contact with the lower surfaces of the first electrodes and extending over the spaces between the adjacent first electrodes.

Preferably, the electroluminescent device is of a passive matrix type in which the first electrodes are formed in a striped pattern, or of an active matrix type in which the first electrodes are pixel electrodes connected to drain electrodes of transistors placed on the substrate.

More preferably, the pixel electrodes are placed on the transistors with the light absorption layer therebetween.

Preferably, the light absorption layer is composed of a material in which a light absorbent is dispersed in a polymeric compound.

Further objects, features and advantages of the present invention will become apparent from the following description of the preferred embodiments with reference to the attached drawings.

DESCRIPTION OF THE PREFERRED EMBODIMENTS

Figure 1:
FIG. 1 is a sectional view which schematically shows a conventional organic EL device.
Figure 1:
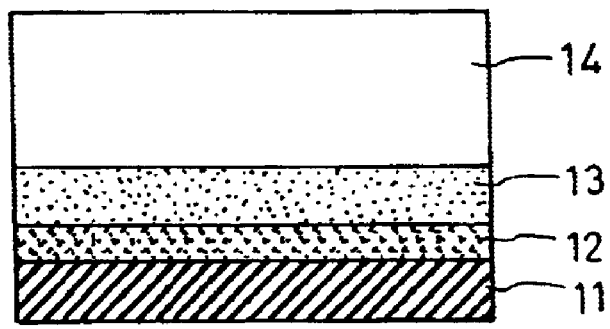
Figure 2:
FIG. 2 is a sectional view which schematically shows another conventional organic EL device.
Figure 2:
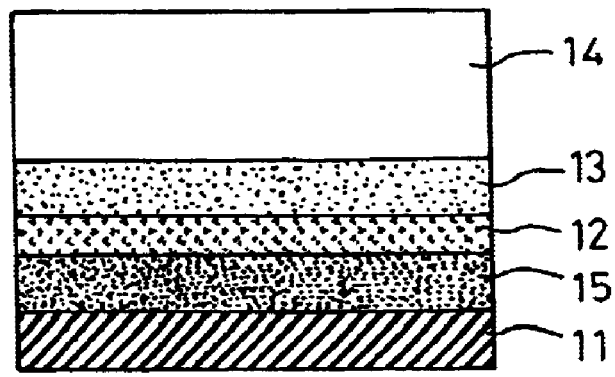
Figure 3:
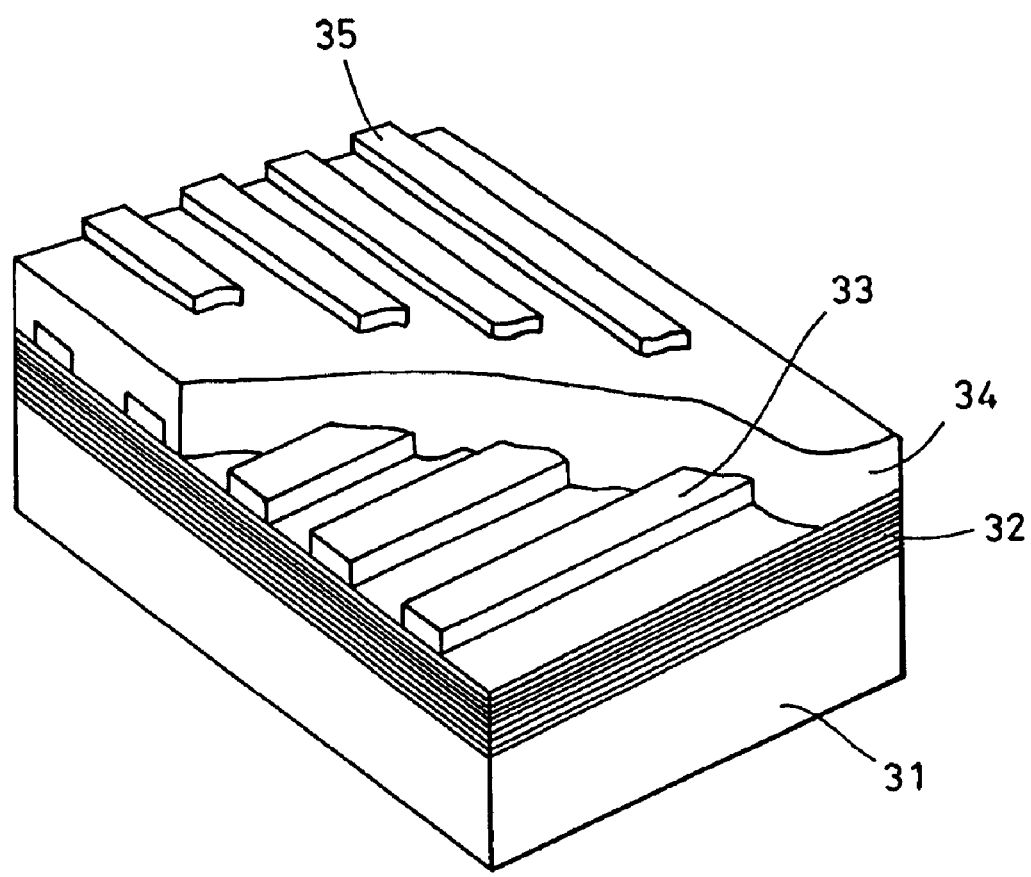
FIG. 3 is a perspective view which schematically shows an organic EL device in an embodiment of the present invention.

FIG. 3 is a schematic diagram showing a passive matrix luminescence device as an organic EL device according to an embodiment of the present invention. As shown in FIG. 3, a light absorption layer 32 is placed over the display region of a glass substrate 31, and first electrodes 33 are formed thereon by patterning in a striped pattern. An organic compound layer 34 containing luminescent sections is formed on the first electrodes 33, and second electrodes 35 are formed thereon by patterning substantially orthogonally to the first electrodes 33.

The first electrodes 33 and the second electrodes 35 are substantially transparent, and light emitted from the luminescent sections contained in the organic compound layer 34 passes through the second electrodes 35 to reach the viewer. Preferably, a transparent conductor, such as ITO, which is usually used on the light emission side is used for the second electrodes 35, and a metal is used for the first electrode 33. When a metal is used for the first electrodes 33, since light is reflected if the thickness of the metal layer is too large, the metal is formed into a thin film with a thickness of approximately 3 to 15 nm so that light is transmitted and not reflected. When a metal thin film with a thickness of 3 to 15 nm is used as an electrode, the resistance is increased. Therefore, more preferably, a a transparent conductor layer is further provided on the substrate side of the first electrode 33 so that the resistance is kept as low as possible even when the first electrode 33 is composed of the metal thin film. As the transparent conductor layer, a conductive material which transmits light, such as ITO or tantalum oxide, may be used.

The light absorption layer 32, which is provided between the substrate 31 and the first electrodes 33, absorbs and/or reflects light. As the light absorption layer 32 used in the present invention, a layer containing a substance which absorbs ambient light entering the device may be used. Examples of such a substance include graphite, carbon black, organic dyes, and inorganic pigments. Specifically, for example, the substance is dispersed in a resin, and the resin is deposited as the light absorption layer 32.

As the first electrode 33 and the second electrode 35 used in the present invention, conductive materials which are usually used for electrodes in devices are preferably used. Examples of the materials for the anode include ITO, indium oxide, tin oxide, $Cd_2SnO_4$, zinc oxide, copper iodide, gold, and platinum. Examples of the materials for the cathode include alkali metals, alkaline-earth metals, and the alloys thereof, such as sodium, potassium, magnesium, lithium, sodium-potassium alloys, magnesium-indium alloys, magnesium-silver alloys, aluminum, aluminum-lithium alloys, aluminum-copper alloys, and aluminum-copper-silicon alloys.

For the luminescent sections in the organic EL device of the present invention, luminescent materials which have been used for the conventional organic EL devices are preferably used. Specifically, for example, aluminum quinolinol complex derivative (represented by $Alq_3$ shown below) are preferably used.

$Alq_3$

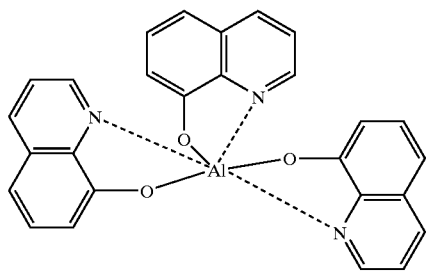

The organic compound layer 34 may include a plurality of layers, and may be provided with a hole-transporting layer and an electron-transporting layer.

Preferred examples of materials for the hole-transporting layer used in the organic EL device of the present invention include the following compounds.

α-NPD

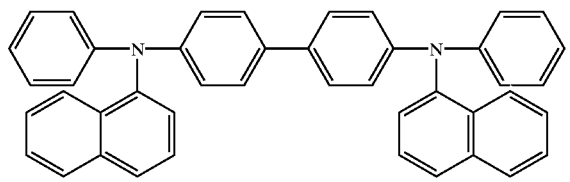

1-TANTA: 4,4',4"-tris(1-naphthylphenylamino)triphenylamine
2-TANTA: 4,4',4"-tris(2-naphthylphenylamino)triphenylamine
TCTA: 4,4',4"-tris(N-carbazoyl)triphenylamine
p-DPA-TDAB: 1,3,5-tris[N-(4-diphenylaminophenyl)phenylamino]benzene
TDAB: 1,3,5-tris(diphenylamino)benzene
TDTA: 4,4',4"-tris(diphenylamino)triphenylamine
TDAPB: 1,3,5-tris[(diphenylamino)phenyl]benzene Examples of materials for the electron-transporting layer used in the organic EL device of the present invention include the following compounds.
BeBq: bis(benzoquinolinolate)beryllium complex
DTVBi: 4,4'-bis-(2,2-di-p-triyl-vinyl)-biphenyl
Eu(DBM)3(Phen): tris(1,3-diphenyl-1,3-propanediono)(monophenanthroline)Eu(III)

Other examples include diphenylethylene derivatives, triphenylamine derivatives, diaminocarbazol derivatives, bisstyryl derivatives, benzothiazole derivatives, benzothiazole derivatives, aromatic diamine derivatives, quinacridon compounds, perylene compounds, oxadiazole derivatives, coumarin compounds, anthraquinone derivatives, distyrylarylene derivatives (DPVBi), and oligothiophene derivatives (BMA-3T). These materials can be desirably deposited in an amorphous state by a vacuum deposition process.

EXAMPLE 1
(Passive Matrix Electroluminescent Device)

A method for fabricating a passive matrix electroluminescent device will be briefly described with reference to FIG. 3. A no-alkali glass substrate with a thickness of 1.1 mm was used. To 100 g of a polyimide solution, "SEMICOFINE L52" (trade name) manufactured by Toray Industries, Inc., 10 g of "Carbon Black #5B" (trade name) manufactured by Mitsubishi Chemical Corporation was added while stirring, and mixing was performed, and then, using a laboratory three-roller mill (manufactured by Kohira Manufacturing Inc.), dispersion was performed until the particle size of the carbon black was 0.2 μm or less. After mixing was performed thoroughly, the solution was defoamed in a vacuum container, and the solution was applied over the substrate by a spinner at a rotational speed of 1,500 rpm. Firing was then performed at 250° C. for one hour. The thickness of the produced light absorption layer was 2 μm and the color of the layer was black by visual observation.

After a transparent ITO conductive film was deposited on the light absorption layer by sputtering at a thickness of 70 nm, first electrodes was formed in a striped pattern with a line width of 150 μm and a line spacing of 15 μm. Luminescent sections of red (R), green (G), and blue (B) colors were formed thereon at the positions corresponding to the individual pixels by applying the following materials by a mask vapor deposition process at a vacuum of $10^{-4}$ Pa.

The structure and the thickness of the luminescent sections for the individual colors were as follows.

R: αNPD (50 nm)/Alq and 0.5 mol % of DCM2 relative to Alq codeposited (50 nm)
G: αNPD (50 nm)/Alq (50 nm)
B: αNPD (50 nm)/BCP (10 nm)/Alq (50 nm)

Herein, DCM stands for 4-(Dicyanomethylene)-2-methyl-6-(4-dimethylaminostyryl)-4H-pyran, which is represented by the following chemical formula.

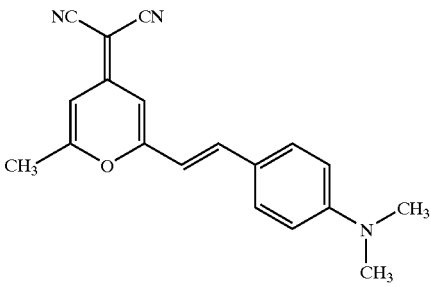

Furthermore, in order to form the second electrodes, Al—Li with a thickness of 1 nm and ITO with a thickness of 100 nm were deposited thereon and patterning was performed orthogonally to the first electrodes with the same line width and line spacing as those of the first electrodes. A scanning signal driver for the passive matrix was connected to the ends of the X-direction lines, and an information signal driver was connected to the Y-direction lines. The device was placed in a nitrogen-purged glass chamber, and when a voltage of 13 V was applied to selected pixels, light emission took place for the individual colors.

The background color of the device viewed from the observer was completely black and the reflectance of light in this state was measured by the method described below. That is, using a luminance meter (BM7) manufactured by Topcon Corporation, luminance of reflected light was measured in a reference atmosphere in the room (at an ambient illuminance of 1,000 lux). The luminance of reflected light of the device of the present invention was 20% on the assumption that the luminance of reflected light of an electroluminescent device fabricated in the same manner without a light absorption layer was 100%. Although the spacing between the two adjacent striped electrodes was 15 μm, the resistance between the adjacent pixels was $10^8$ Ω or more, exhibiting sufficient insulating properties. Furthermore, since the light absorption layer is placed between the electrodes, the entire device appeared to be black.

COMPARATIVE EXAMPLE 1

An electroluminescent device was fabricated in the same manner as Example 1 apart from the fact that an insulating film was formed on the light absorption layer at a thickness of 100 nm using the polyimide solution which had been diluted. The luminance of reflected light was 40%, which was larger than Example 1. The reason for this is believed to be that in general, as the number of layers composed of different materials is increased, reflected light easily occurs due to a difference in refractive index between the interfaces. Therefore, the light absorption layer is preferably in close contact with the first electrodes. Accordingly, since the light absorption layer is placed extending over the spaces between the adjacent pixel electrodes, the light absorption layer itself must be electrically insulating.

EXAMPLE 2
(Active Matrix Electroluminescent Device)

An active matrix electroluminescent device of the present invention will be described with reference to FIGS. 4 to 6.

Figure 4:
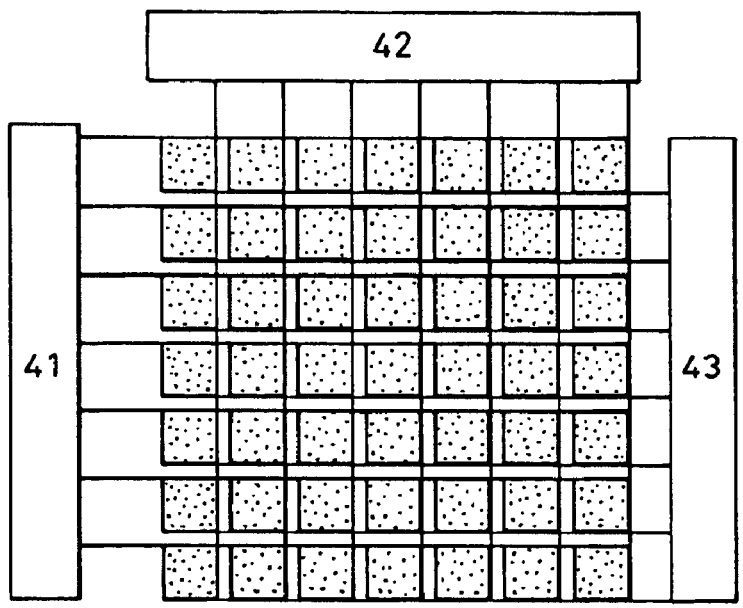
FIG. 4 is a plan view of an organic EL device in another embodiment of the present invention.

FIG. 4 is a plan view of an active matrix electroluminescent device using thin-film transistors. Gate lines of the thin-film transistors are arrayed in the X direction and the ends thereof are connected to a scanning signal driver 41. Signal lines are arrayed in the Y direction and the ends thereof are connected to an information signal driver 42. A current supply circuit 43 is connected the side of the array in the X direction, and a current is applied to the organic electroluminescent device to emit light by the timing of the scanning signal driver 41 and the information signal driver 42.

Figure 5:
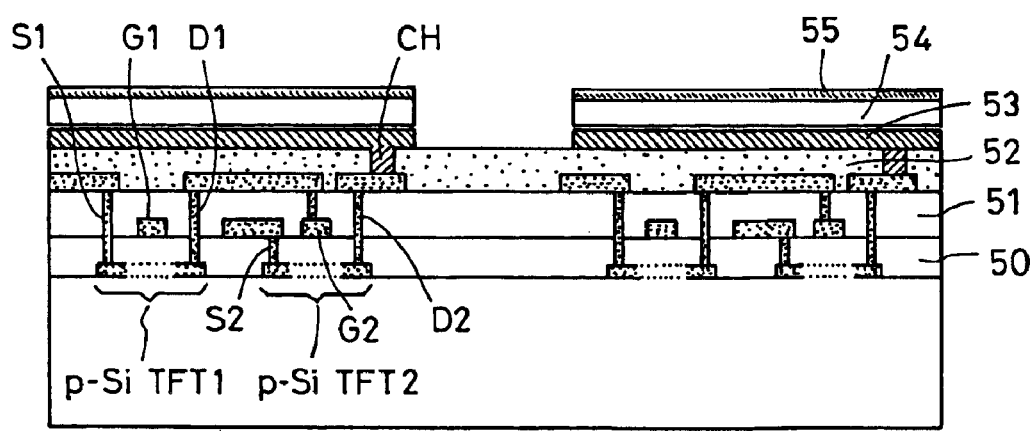
FIG. 5 is a sectional view of a display apparatus using an organic EL device in accordance with the present invention.

FIG. 5 is a sectional view of an electroluminescent device of the present invention. A method for fabricating the electroluminescent device will be described below. An amorphous silicon (a-Si) film was deposited by CVD at a thickness of 40 nm on a no-alkali glass substrate having a thickness of 1.1 mm. Patterning was performed excluding the region for forming transistors. After a polysilicon (p-Si) film was obtained by laser annealing, source and drain regions were formed by ion implantation in accordance with the conventional method. As a gate insulating layer 50, a SiN film with a thickness of 100 nm was formed thereon by CVD. Contact holes were formed in the gate insulating layer 50, and by sputtering aluminum at a thickness of 500 nm, gate electrodes G1 and G2 and electrodes for current supply lines which also act as electrodes for memory capacitors were formed, and thereby a p-Si TFT1 and a p-Si TFT2 shown in FIG. 5 were obtained.

Furthermore, in order to form an interlayer insulation film 51, a polyimide (trade name "SEMICOFINE LP52") manufactured by Toray Industries, inc. was applied thereon using a spinner at a rotational speed of 1,500 rpm, followed by firing at 230° C. for one hour. The thickness of the produced interlayer insulation film was 1.5 $\mu$m. Contact holes were formed in the source/drain regions, and by depositing aluminum thereon at a thickness of 600 nm by sputtering, source electrodes S1 and S2, drain electrodes D1 and D2, and the other electrodes of the memory capacitors were formed.

A light absorption layer 52 of the present invention was then formed in the same process as for the passive matrix device described above, that is, a solution in which 10% by weight of carbon black was mixed in the polyimide solution manufactured by Toray Industries, Inc. was applied thereto, followed by firing. Thereby, the layer 52 which was black by visual observation was obtained. The flatness of the layer was measured by a contact-type profilometer (Talystep manufactured by ULVAC, Inc.), and the measured maximum step height was 25 nm. Thus, the flatness of the light absorption layer 52 was satisfactory. Preferably, the maximum step height is one half or less of the thickness of an organic compound layer 54 including luminescent sections. If the maximum step height exceeds the above, short-circuiting easily occurs between first electrodes and second electrodes, resulting in a decrease in the yield of the devices.

Next, contact holes CH were formed in the light absorption layer 52 in the sections corresponding to the drain electrodes, and transparent electrodes for forming pixel electrodes 53 were disposed at a thickness of 70 nm and patterning was performed so as to obtain a predetermined size. Furthermore, in the same process, current supply lines and grounding lines were formed along gate lines. Next, in the same manner as Example 1, luminescent sections of red (R), green (G), and blue (B) colors were formed at the positions corresponding to the individual pixels by applying the materials by a mask vapor deposition process at a vacuum of $10^{-4}$ Pa. In order to form the second electrodes, Al—Li with a thickness of 1 nm and ITO with a thickness of 100 nm were deposited further thereon and patterning was performed according to the individual pixels.

The gate lines were connected to the scanning signal driver 41 shown in FIG. 4, the information signal lines were connected to the information signal driver 42, the current supply lines were connected to lead electrodes, such as the current supply circuit 43. Then, light emission was performed in a nitrogen-purged glass chamber.

Figure 6:
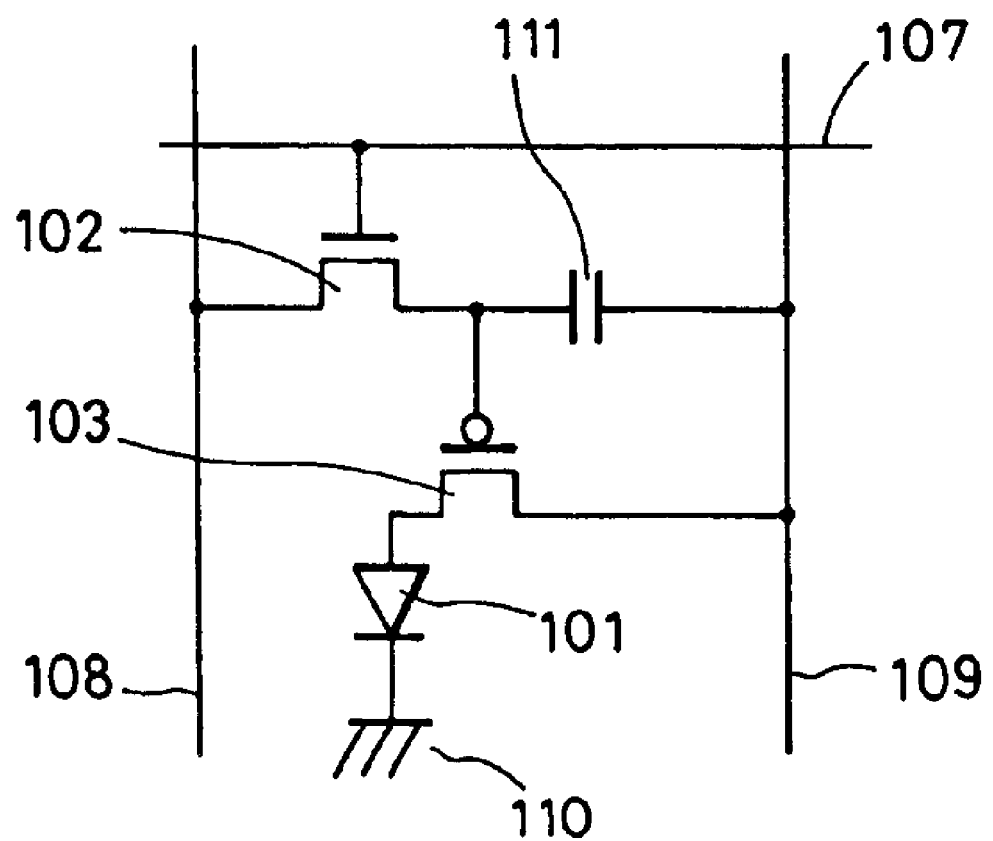
FIG. 6 is an equivalent circuit diagram for each pixel in a display apparatus using an organic EL device in accordance with the present invention.

FIG. 6 is an equivalent circuit diagram for each pixel in the organic electroluminescent device in this example. In FIG. 6, numeral 101 represents an organic EL device corresponding to the layers 53 to 55 shown in FIG. 5; numeral 102 and 103 represent TFTs corresponding the TFT1 and the TFT2 shown in FIG. 5, respectively; numeral 108 represents a scanning line connected to the gate electrode G1 shown in FIG. 5; numeral 107 represents an information signal line connected to the source electrode S1 shown in FIG. 5; numeral 109 represents a current supply line connected to the source electrode S2 shown in FIG. 5; numeral 110 represents a ground; and numeral 111 represents a memory capacitor.

The operation of this drive circuit will be described below. When the TFT102 is turned on by the scanning line 108, the image data voltage from the signal line 107 is stored in the memory capacitor 111. Even if the scanning line 108 is turned off and the TFT102 is in the OFF state, the voltage continues to be supplied to the control electrode of the TFT103, and therefore, the TFT103 continues to be in the ON state.

On the other hand, in the TFT103, the first primary electrode is connected to the current supply line 109, the second primary electrode is connected to the first electrode of the EL device, and the image data voltage is inputted to the control electrode which is connected to the second primary electrode of the TFT102. The current between the first primary electrode and the second primary electrode is controlled by the image data voltage. At this stage, the organic EL device 101, which is placed between the current supply line 109 and the ground 110, emits light in response to the current.

In this structure, the capacitance of the memory capacitor depends on the thickness of the light absorption layer because the memory capacitor is formed with the light absorption layer therebetween. If the capacitance is too large, the load on the scanning line driver is increased, which is not desirable. Therefore, preferably, the light absorption layer has a thickness sufficient for absorbing light and also has a predetermined thickness for decreasing the capacitance. Preferably, the thickness of the light absorption layer is five or more times the thickness of the organic compound layer (including the luminescent sections). Furthermore, in order to improve the flatness of the surface of the light absorption layer, the larger thickness is preferable.

COMPARATIVE EXAMPLE 2

An electroluminescent device was fabricated in the same manner as Example 2 apart from the fact that a transparent polyimide solution without containing carbon black was applied at the same thickness. The advantage of the light absorption layer of the present invention was tested by the following method.

Using a luminance meter (BM7) manufactured by Topcon Corporation, luminance of reflected light was measured in a reference atmosphere in the room. The absolute value of the luminance of reflected light was large because of additional reflection by the metal of the source electrode and drain electrode. The ambient illuminance was 1,000 lux. The luminance of reflected light of the device of Example 2 was 20%, which was sufficiently low, in the non-emission period, on the assumption that the luminance of reflected light of the device of Comparative Example 2 was 100%.

EXAMPLE 3

Other materials were investigated in order to form the light absorption layer of the EL device of the present invention. In the manner similar to Example 1, 5% by weight of each of the following materials was added to the polyimide solution, and after mixing was performed using the three-roller mill, the solution was defoamed in a vacuum and applied over a substrate by a spinner.

| Light absorbent | Thickness of light absorption layer | Luminance of reflected light |
| --- | --- | --- |
| (1) Graphite | 1.5 μm | 30% |
| (2) Black iron oxide | 2.0 μm | 20% |

As is obvious from the test results described above, it is possible to use a common black material, such as carbon black or graphite, as the material, which can be dispersed in a polymeric material, for the light absorption layer of the present invention. An inorganic pigment, such as black iron oxide, is also effective. Regarding the inorganic pigment, cobalt oxide, nickel oxide, and the like are also effective because they absorb a wide range of wavelengths of visible light.

Preferably, an organic dye, such as copper phthalocyanine, is used because it has superior dispersibility in the polyimide solution and the resulting light absorption layer has superior flatness. Other examples of the organic dye include aniline black. These organic dyes have superior dispersibility, and the fabrication is facilitated.

In the present invention, a substantially transparent electrode is used as the first electrode, and the light absorption layer is disposed in close contact with the first electrode. The reason for this is that if another insulating layer is placed between the electrode and the light absorption layer, interference of light easily occurs, and the luminance by reflected light is easily increased.

EXAMPLE 4

A thin-film transistor substrate similar to Example 2 was prepared using the organic EL device of the present invention, and a second substrate provided with a second electrode was placed opposite to the thin-film transistor substrate. Thereby, an active matrix electroluminescent device was fabricated. Basically, the active matrix electroluminescent device had the same structure as Example 2 apart from the fact that the second electrode was preliminarily formed on the second substrate, which was placed on the thin-film transistor substrate with a liquid crystal-type conductive material therebetween.

[Structure of TFT Substrate]
Copper phthalocyanine (200 nm)/ITO (50 nm)/Al—Li alloy (5 nm)/Alq3 (20 nm)/α-NPD (60 nm)
[Structure of Counter Substrate (Corresponding to the Second Substrate of the Present Invention)]
ITO (70 nm)/HHOT (500 nm)
[Fabrication of TFT Substrate]
On a glass substrate (surface roughness ±2 nm) with a thickness of 1.1 mm corresponding to the first substrate provided with thin-film transistors (TFTs) and lines for matrix driving the TFTs, which had the same sectional structure as that shown in FIG. 5, copper phthalocyanine was deposited by vacuum deposition, as the light absorption layer, at a thickness of 510 nm and at a vacuum of $2.66 \times 10^{-3}$ Pa. An ITO film was formed thereon by sputtering at a thickness of 50 nm as the transparent conductor layer. Next, as the first electrode (pixel electrode), an Al—Li alloy (Li: 1.3% by weight) was deposited thereon by vacuum deposition for each pixel at a thickness of 5 nm and at a vacuum of $2.66 \times 10^{-3}$ Pa.

Next, as the luminescent layer, Alq3 was deposited on the first electrode by vacuum deposition at a thickness of 20 nm and at a vacuum of $2.66 \times 10^{-3}$ Pa, and further thereon, α-NPD (manufactured by Dojindo Laboratories) was deposited by vacuum deposition at a thickness of 60 nm and at a vacuum of $2.66 \times 10^{-3}$ Pa.

[Fabrication of Counter Substrate]
As the second electrode, an ITO film with a thickness of approximately 70 nm was formed by sputtering on a glass substrate with a thickness of 1.1 mm corresponding to the second substrate.

Hexahexyloxytriphenylene (HHOT) was deposited on the second electrode by vacuum deposition at a thickness of 500 nm and at a vacuum of $2.66 \times 10^{-3}$ Pa. The HHOT layer may be formed by a spin-coating method using HHOT dissolved in chloroform, followed by drying.

The structure and the phase transition of HHOT are as follows.

HHOT

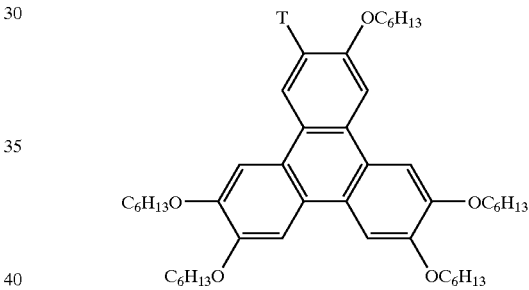

Phase transition temperature (° C.):
Cry.→$D_{hd}$ (68.4° C.)
$D_{hd}$→$I_{so}$. (98.9° C.)
Cry.: crystal phase
$D_{hd}$: discotic hexagonal disordered phase
$I_{so}$.: isotropic liquid phase
[Fabrication of Device]
A sealant was applied to the outside of the display region of the counter substrate, and by heating only the counter substrate to the temperature at which HHOT was transformed into the liquid phase, the counter substrate was brought into close contact with the α-NPD layer of the TFT substrate under a reduced pressure. The sealant was then cured by UV light, and thereby a device was obtained. The device had 100×100 pixels, and it was confirmed that monochrome display was enabled.

The advantage of this structure is in that since the second electrode is arranged on the second substrate, the second electrode is not formed directly on the organic compound layer including the luminescent sections by sputtering or the like, and thereby the organic compound layer is not substantially damaged.

COMPARATIVE EXAMPLE 3

A luminescent device similar to that of Example 4 was fabricated apart from the fact that the light absorption layer and the transparent conductor layer were not formed and an Al—Li layer acting as the first electrode had a thickness of 30 nm.

Evaluation was conducted on the device fabricated in Example 4 and the device fabricated in Comparative Example 3. Peripheral drive circuits were connected to each of the devices, and matrix driving was performed at a source voltage of 9 to 12 V. Four fluorescent light tubes of 400 W were switched on, and reflected glare 2 m below the tubes was observed by five observers. Additionally, in the same environment, the contrast between the luminescent sections and the non-luminescent sections were measured. As a result, with respect to the device of Comparative Example 3, all of the five observers observed reflected glare, while with respect to the device of Example 4, all of the five observers did not observe reflected glare. When the contrast of the luminescent sections to the non-luminescent sections was measured, the contrast of the device of Comparative Example 3 was 4:1, while the contrast of the device of Example 4 was 43:1.

As described above, in accordance with the present invention, in an organic EL device, it is possible to suppress glare due to reflection of ambient light without decreasing the luminance and it is also possible to significantly increase the versatility of the possible structure of the light absorption layer. It is also possible to build the switching elements, circuits, etc. for driving below the pixel electrode at the first substrate side, and thus no restrictions are imposed on the aperture ratio for light, resulting in an increase in light emitting efficiency. In the display apparatus of the present invention in which the second substrate is used, because of the advantages of the present invention described above, reflected glare is suppressed, and high impact resistance, stability, durability, and quality are exhibited.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An electroluminescent device comprising:

a plurality of first electrodes, formed on a substrate;

an organic compound layer formed on said first electrodes;

a second electrode, with said first electrodes and said second electrode being substantially light transmissive; and a light absorption layer comprising an electrical insulator, with said light absorption layer being placed under said plurality of first electrodes and extending over spaces between adjacent first electrodes, said light absorption layer being placed between said first electrodes and said substrate, and said second electrode being a light output electrode, wherein said plurality of first electrodes are pixel electrodes connected to drain electrodes of transistors placed on said substrate, and wherein said pixel electrodes are placed on said transistors with said light absorption layer therebetween.

2. An electroluminescent device according to claim 1, wherein said plurality of first electrodes are formed in a striped pattern.

3. An electroluminescent device according to claim 1, wherein said second electrode is placed on a light extracting side.

4. An electroluminescent device according to claim 1, wherein said light absorption layer is in contact with a lower surface of each of said plurality of first electrodes.

5. An electroluminescent device according to claim 1, wherein said pixel electrodes are connected to said drain electrodes of said transistors through contact holes provided in said light absorption layer.

6. An electroluminescent device according to claim 1, wherein a maximum step height in a surface of said light absorption layer is one half or less of a thickness of said organic compound layer.

7. An electroluminescent device according to claim 1, wherein a thickness of said light absorption layer is five or more times a thickness of said organic compound layer.

8. An electroluminescent device according to claim 1, wherein said light absorption layer comprises a material in which a light absorbent is dispersed in a polymeric compound.

9. An electroluminescent device according to claim 8, wherein the light absorbent is an inorganic material.

10. An electroluminescent device according to claim 8, wherein the light absorbent is an organic dye.

11. An electroluminescent device according to claim 1, wherein said second electrode is a plurality of second electrodes.

12. An image display apparatus according to claim 11, wherein said light absorption layer is in contact with a lower surface of each of said plurality of first electrodes.

13. An electroluminescent device according to claim 11, wherein said plurality of second electrodes are formed on said organic compound layer in a striped pattern which is substantially orthogonal to a striped pattern formed by said plurality of first electrodes.

* * * * *

UNITED STATES PATENT AND TRADEMARK OFFICE
CERTIFICATE OF CORRECTION

PATENT NO. : 6,836,068 B2
DATED : December 28, 2004
INVENTOR(S) : Manabu Furugori et al.

It is certified that error appears in the above-identified patent and that said Letters Patent is hereby corrected as shown below:

Title page,
Item [56], References Cited, FOREIGN PATENT DOCUMENTS, "04225328" should read -- 04-225328 --.

Column 5,
Line 30, "benzothia-a" should read -- benzooxa- --.

Column 8,
Line 13, "corresponding" should read -- corresponding to --.

Column 10,
Lines 30-40, "HHOT" should read

-- HHOT

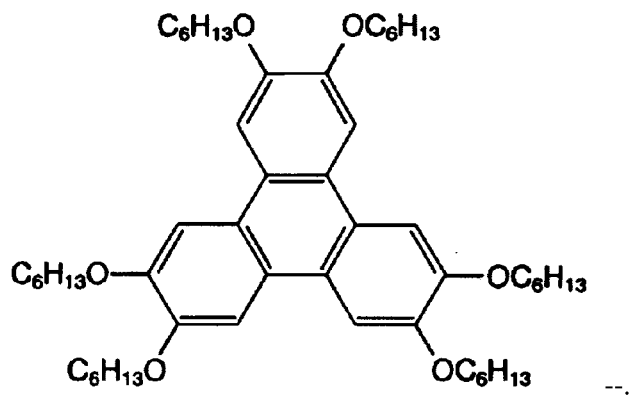

--.

UNITED STATES PATENT AND TRADEMARK OFFICE
CERTIFICATE OF CORRECTION

PATENT NO. : 6,836,068 B2
DATED : December 28, 2004
INVENTOR(S) : Manabu Furugori et al.

It is certified that error appears in the above-identified patent and that said Letters Patent is hereby corrected as shown below:

Column 12,
Line 44, "image display apparatus" should read -- electroluminescent device --.

Signed and Sealed this

Seventh Day of March, 2006

JON W. DUDAS
*Director of the United States Patent and Trademark Office*